(12) United States Patent
Cao et al.

(10) Patent No.: US 7,746,640 B2
(45) Date of Patent: Jun. 29, 2010

(54) HEAT DISSIPATION DEVICE WITH HEAT PIPES

(75) Inventors: Lei Cao, Shenzhen (CN); Dong-Bo Zheng, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 349 days.

(21) Appl. No.: 11/777,034

(22) Filed: Jul. 12, 2007

(65) Prior Publication Data

US 2009/0016023 A1    Jan. 15, 2009

(51) Int. Cl.
*H05K 7/20* (2006.01)
*F28F 7/00* (2006.01)
*H01L 23/34* (2006.01)

(52) U.S. Cl. ............... 361/700; 361/679.52; 361/709; 165/80.4; 165/80.5; 165/104.33; 174/15.2; 257/714

(58) Field of Classification Search ............... 361/699, 361/700, 710; 165/80.3, 104.33, 185; 174/15.2; 257/714
See application file for complete search history.

(56) References Cited

U.S. PATENT DOCUMENTS

| 2007/0074857 | A1* | 4/2007 | Xia et al. | 165/104.33 |
| 2007/0215321 | A1* | 9/2007 | Yang et al. | 165/80.3 |
| 2008/0093052 | A1* | 4/2008 | Yang et al. | 165/104.33 |

FOREIGN PATENT DOCUMENTS

| CN | 2634657 Y | 8/2004 |
| CN | 1925734 A | 3/2007 |

* cited by examiner

*Primary Examiner*—Zachary M Pape
(74) *Attorney, Agent, or Firm*—Frank R. Niranjan

(57) ABSTRACT

A heat dissipation device includes a base for contacting an electronic device, a fin set located on the base and first, second heat pipes thermally engaged in the base. The first heat pipe comprises a first transferring portion and two second transferring portions extending from two opposite free ends of the first transferring portion. The second heat pipe has first and second transferring sections. The first transferring section of the second heat pipe is located adjacent to the first transferring portion of the first heat pipe and between the first transferring portion and one of the second transferring portions of the first heat pipe, and the second transferring section of the second heat pipe is located adjacent to the one of the second transferring portions of the first heat pipe.

5 Claims, 4 Drawing Sheets

HEAT DISSIPATION DEVICE WITH HEAT PIPES

BACKGROUND OF THE INVENTION

1. Field of the Invention

The present invention relates to heat dissipation devices for use in removing heat from electronic devices, and more particularly to a heat dissipation device incorporating heat pipes for improving heat dissipation efficiency of the heat dissipation device.

2. Description of Related Art

During operation of an electronic device such as a computer central processing unit (CPU) mounted on a printed circuit board, a large amount of heat is often produced. The heat must be quickly removed from the CPU to prevent it from becoming unstable or being damaged. Typically, a heat dissipation device is attached to an outer surface of the CPU to absorb heat from the CPU. The heat absorbed by the heat dissipation device is then dissipated to ambient air.

Conventionally, a heat dissipation device comprises a solid metal base attached on the CPU, and a plurality of fins arranged on the base. The base is intimately attached to the CPU thereby absorbing the heat generated by the CPU. Most of the heat accumulated at the base is transferred firstly to the fins and then dissipates away from the fins. However, as electronics technology continues to advance, increasing amounts of heat are being generated by powerful state-of-the-art CPUs. As a result, many conventional heat dissipation devices are no longer able to efficiently remove heat from these CPUs.

In order to overcome the above set out problems, a type of heat dissipation device illustrated as follows can be used. The heat dissipation device comprises a base for absorbing heat from a heat generating electronic device, a heat pipe thermally combined to the base, and a plurality of fins arranged on the base. Generally, the heat pipe is linear. The base defines a corresponding groove substantially in a center thereof receiving the heat pipe therein. In use, the base contacts the electronic device and absorbs heat from the electronic device. The heat in the base is absorbed by the heat pipe, and the heat pipe transfers the heat from the center to other parts of the base. The heat in the base spreads to the fins to be dissipated to ambient air. However, the heat pipe is straight, which results in a thermal contact area between the base and the heat pipe is considerably small. Consequently, the heat in the center of the base cannot be transmitted to other parts of the base rapidly and evenly. The heat generated by the electronic device accumulates in the center of the base and the electronic device. Normal functions and abilities of the electronic device are adversely affected. Therefore, the heat dissipation device needs to be improved.

What is needed, therefore, is a heat dissipation device has a large heat dissipation capacity for an electronic device.

SUMMARY OF THE INVENTION

A heat dissipation device in accordance with a preferred embodiment of the present invention is used for dissipating heat generated by an electronic device. The heat dissipation device comprises a base for contacting the electronic device. A fin set is located on the base for dissipating heat in the base to ambient air. A first heat pipe thermally engaged with the base for absorbing heat from the electronic device and spreading the heat to the base. The first heat pipe comprises a first transferring portion and two second transferring portions extending from two opposite free ends of the first transferring portion in opposite extension directions. A second heat pipe is thermally engaged with the base for absorbing heat from the electronic device and spreading the heat to the base. The second heat pipe has a first transferring section and a second transferring section extending from a free end of the first transferring section and parallel to the first transferring section. The first transferring section of the second heat pipe is located adjacent to the first transferring portion of the first heat pipe and the second transferring section of the second heat pipe is located adjacent to one of the second transferring portions of the first heat pipe. The first and second heat pipes cover most of a face of the base and spread the heat from the electronic device to all parts of the base rapidly. Therefore, the heat generated by the electronic device is evenly distributed to the base and heat dissipation capacity of the heat dissipation device of the present invention is improved greatly.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
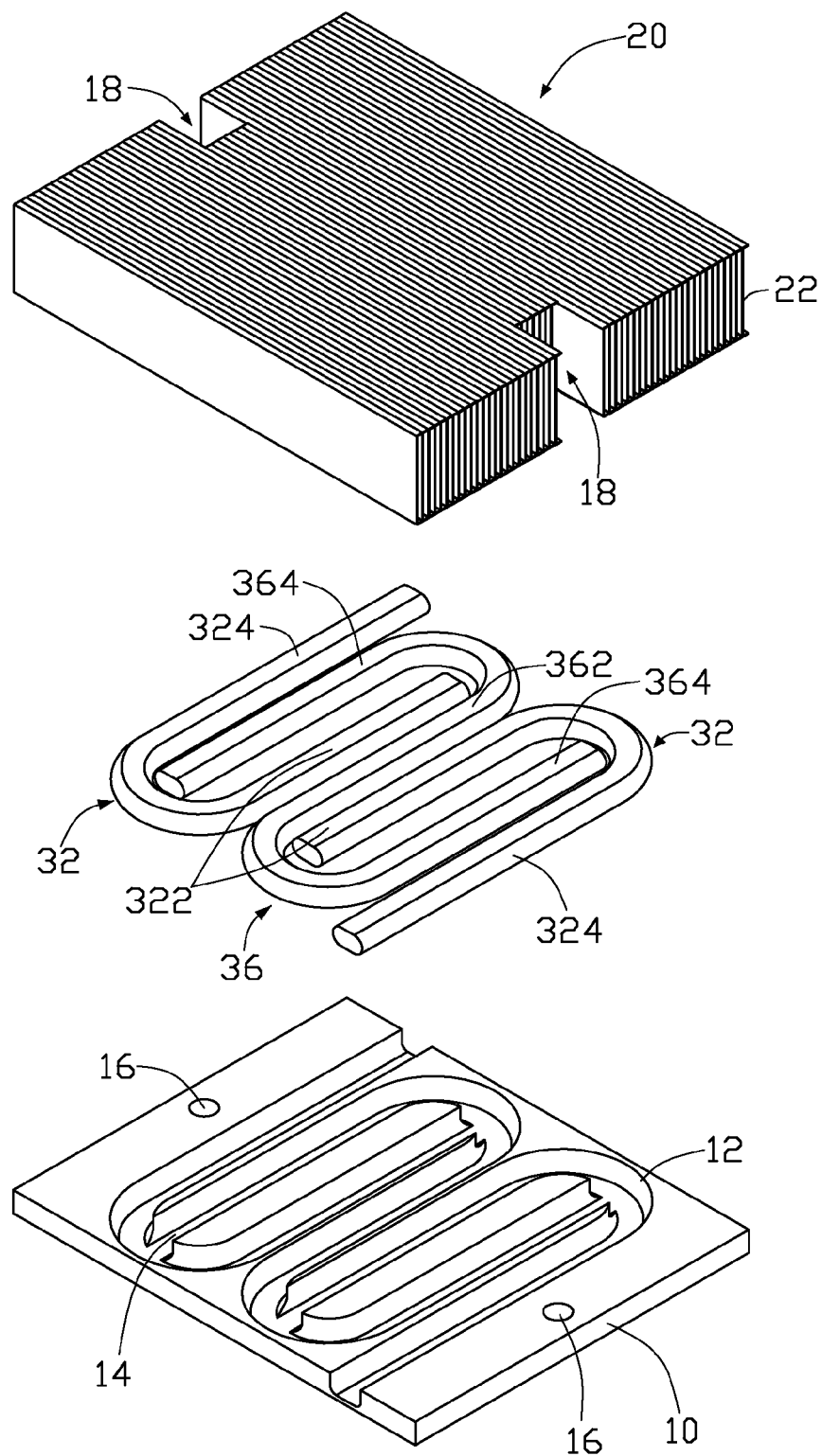
FIG. 1 is an exploded, isometric view of a heat dissipation device in accordance with a first embodiment of the present invention.
Figure 2:
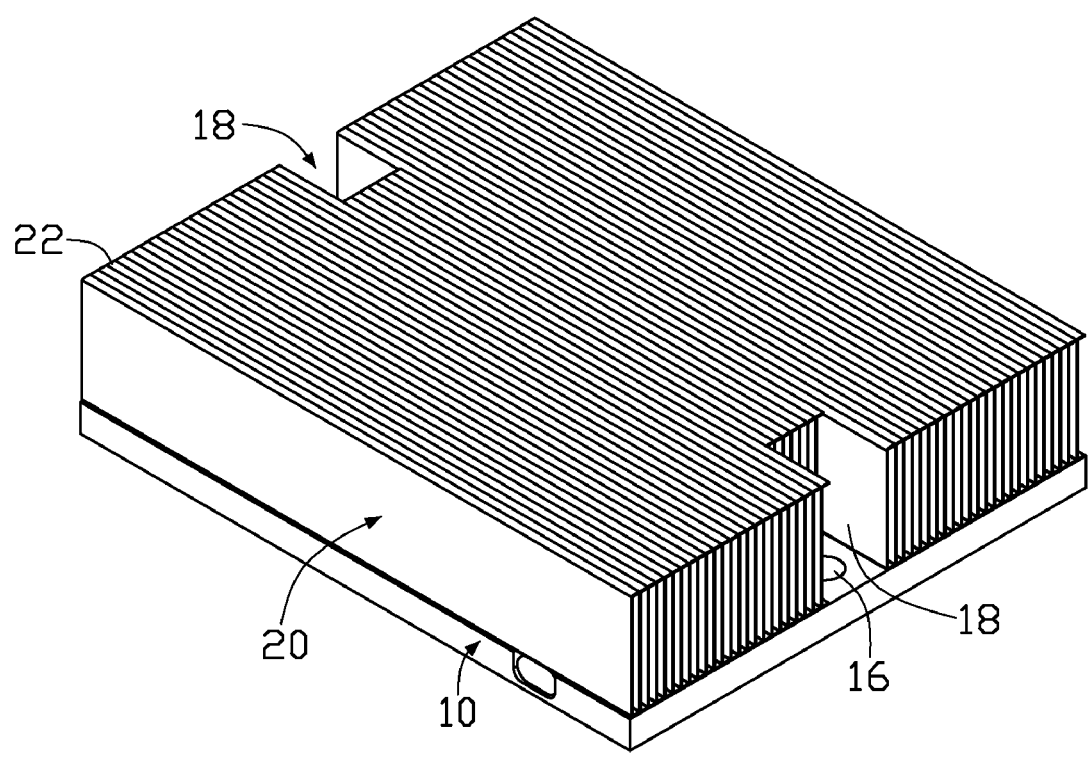
FIG. 2 is an assembled view of FIG. 1.

Referring to FIGS. 1-2, a heat dissipation device in accordance with a first embodiment of the present invention is used for dissipating heat generated by an electronic device (not shown) located on a printed circuit board (not shown). The heat dissipation device comprises a base 10, a fin set 20 for being soldered on and thermally contacting with the base 10, and a first heat pipe 36 and two second heat pipes 32 for being embedded in the base 10 and thermally connecting with the base 10 and the fin set 20.

The base 10 is a substantially rectangular metal plate having good heat conductivity, and has a bottom face (not shown) for contacting the electronic device and a top face (not labeled) opposite to the bottom face. A first groove 14 and a pair of second grooves 12 are defined in the top face of the base 10, for receiving corresponding the first and second heat pipes 36, 32 therein. The first groove 14 is substantially S-shaped and defined in a center portion of the top face of the base 10. The second grooves 12 each are substantially U-shaped and oriented to enclose a free end of the first groove 14. The second grooves 12 are defined parallel in the top face of the base 10 and have opposing orientations. A pair of fastening holes 16 are defined in a pair of short sides of the base 10, for a pair of mounting components (not shown) to extend therein and secure the base 10 onto the printed circuit board.

The fin set 20 comprises a plurality of fins 22 assembled together to be disposed on the top face of the base 10. A pair of cutouts 18 each with a rectangular section are defined in a pair of opposite lateral sides of the base 10, corresponding to the fastening holes 16 in the base 10.

The first heat pipe 36 is substantially S-shaped in profile, and comprises three parallel sections: a first transferring portion 362, two second transferring portions 364 extending from two opposite free ends of the first transferring portion 362 in opposite extension directions. Each second heat pipe 32 comprises a first transferring section 322 and a second transferring section 324 extending from a free end of the first transferring section 322 and parallel to the first transferring section 322. The second transferring portions 364 of the first heat pipe 36 are enclosed by the second heat pipes 32, respectively. The first transferring sections 322 of the second heat pipes 32 are located adjacent to two opposite sides of the first transferring portion 362 of the first heat pipe 36 and oriented parallel to the first transferring portion 362 of the first heat pipe 36. The second transferring sections 324 of the second heat pipes 32 are located adjacent to the second transferring portions 364 of the first heat pipe 36, respectively. Openings of the second heat pipes 32 are oriented facing openings of the first heat pipe 36, respectively.

The first, second heat pipes 36, 32 are thermally received in corresponding first, second grooves 14, 12 in the top face of the base 10, wherein the first, second transferring portions 362, 364 of the first heat pipe 36 and the first, second transferring sections 322, 324 of the second heat pipes 32 are thermally engaged in their respective first, second grooves 14, 12 of the base 10. The first, second heat pipes 36, 32 are thermally embedded in the first, second grooves 14, 12 of the base 10. The first, second transferring portions 362, 364 of the first heat pipe 36 and the first, second transferring sections 322, 324 of the second heat pipes 32 are aligned parallel on the base 10. In this case, in the top face of the base 10, the first and second heat pipes 36, 32 are coplanar with the base 10 and substantially bestrew most of the top face of the base 10.

In use, the base 10 has the bottom face thermally contacting the electronic device to absorb heat generated by the electronic device. The first transferring portion 362 of the first heat pipe 36 and the first transferring sections 322 of the second heat pipes 32, which are located in the center portion of the top face of the base 10, absorb the heat from the electronic device via the base 10. The heat in the first transferring portion 362 of the first heat pipe 36 and the first transferring sections 322 of the second heat pipes 32 is quickly transmitted to all parts of the base 10 by the second transferring portions 364 of the first heat pipe 36 and the second transferring sections 324 of the second heat pipes 32. The heat in the base 10 and the heat pipes 36, 32 is then transmitted to the fins 22 of the fin set 20 and finally dissipated to ambient air through the fins 22.

According to the first embodiment of the present invention, the first, second heat pipes 36, 32 cover most of the top face of the base 10 and spread the heat from the electronic device to all parts of the base 10 rapidly. Therefore, the heat generated by the electronic device is evenly distributed to the base 10 by the first, second heat pipes 36, 32 rapidly and is transmitted to the fin set 20 to be dissipated to the ambient air. In comparison with the related art, heat dissipation capacity of the heat dissipation device of the present invention is improved greatly.

Figure 3:
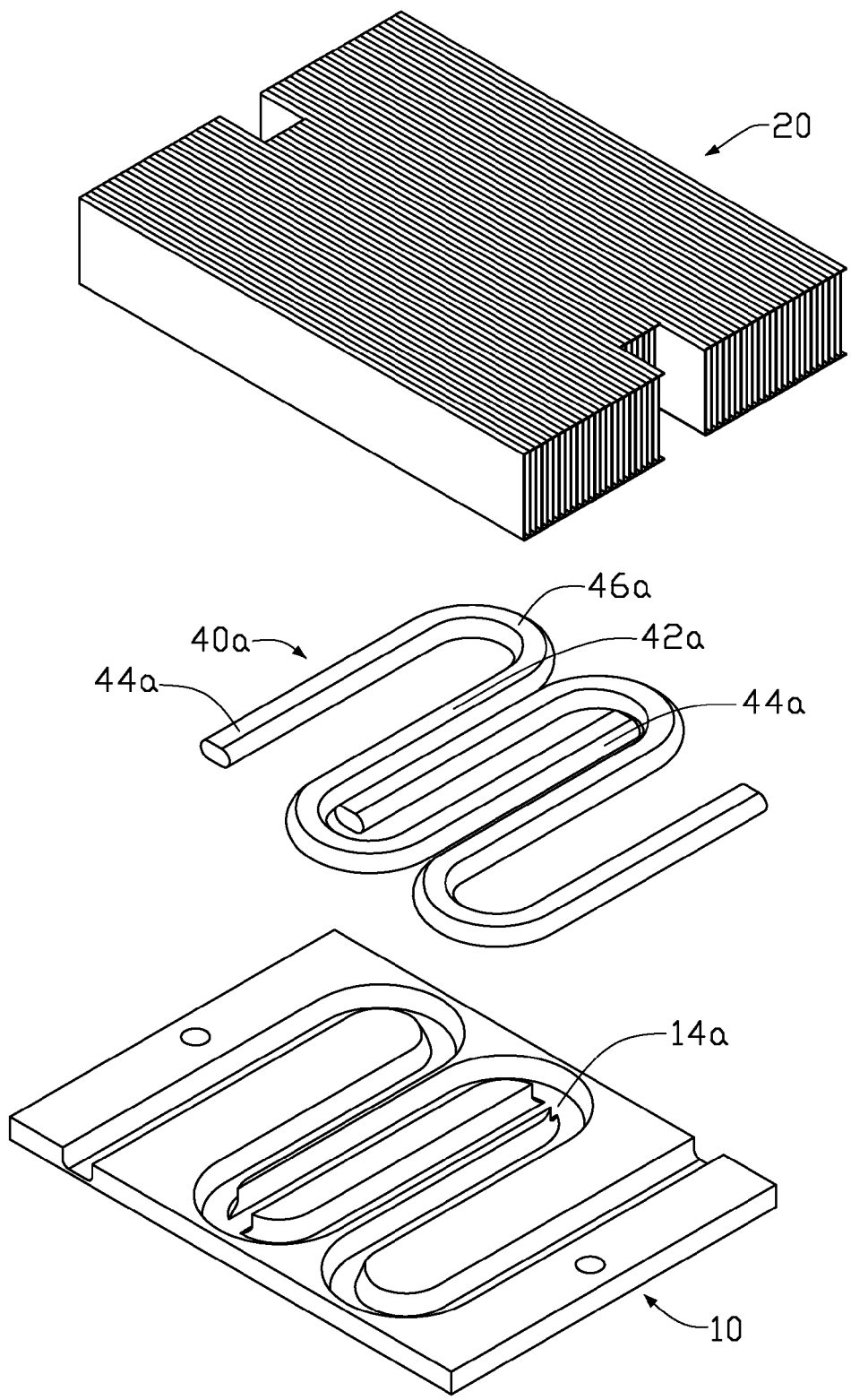
FIG. 3 is an exploded, isometric view of a heat dissipation device in accordance with a second embodiment of the present invention.

Referring to FIG. 3, a heat dissipation device in accordance with a second embodiment of the present invention is shown. The heat dissipation device is similar to the first embodiment of the present invention; a difference therebetween is that two first heat pipes 40a in the second embodiment instead of the first and second heat pipes 36, 32 in the first embodiment are thermally engaged in the top face of the base 10. Each first heat pipe 40a is substantially S-shaped in profile, and comprises a first transferring portion 42a, two second transferring portions 44a extending from two opposite free ends of the first transferring portion 42a in opposing extension directions and a pair of connecting portions 46a located between the first transferring portions 42a and second transferring portions 44a. The first and second transferring portions 42a, 44a of the first heat pipe 40a are oriented parallel on the top face of the base 10. The first transferring portion 42a of one of the first heat pipes 40a is located adjacent to one of the two second transferring portions 44a of the other first heat pipe 40a. One of the second transferring portions 44a of one of the first heat pipes 40a is enclosed by one of the connecting portions 46a of the other first heat pipe 40a and the first and second transferring portions 42a, 44a of the other first heat pipe 40a in connection with the one of the connection portions 46. A pair of S-shaped first grooves 14a are defined in the top face of the base 10, which are oriented with an arrangement corresponding to the arrangement of the two first heat pipes 40a, for receiving the two first heat pipes 40a therein.

Figure 4:
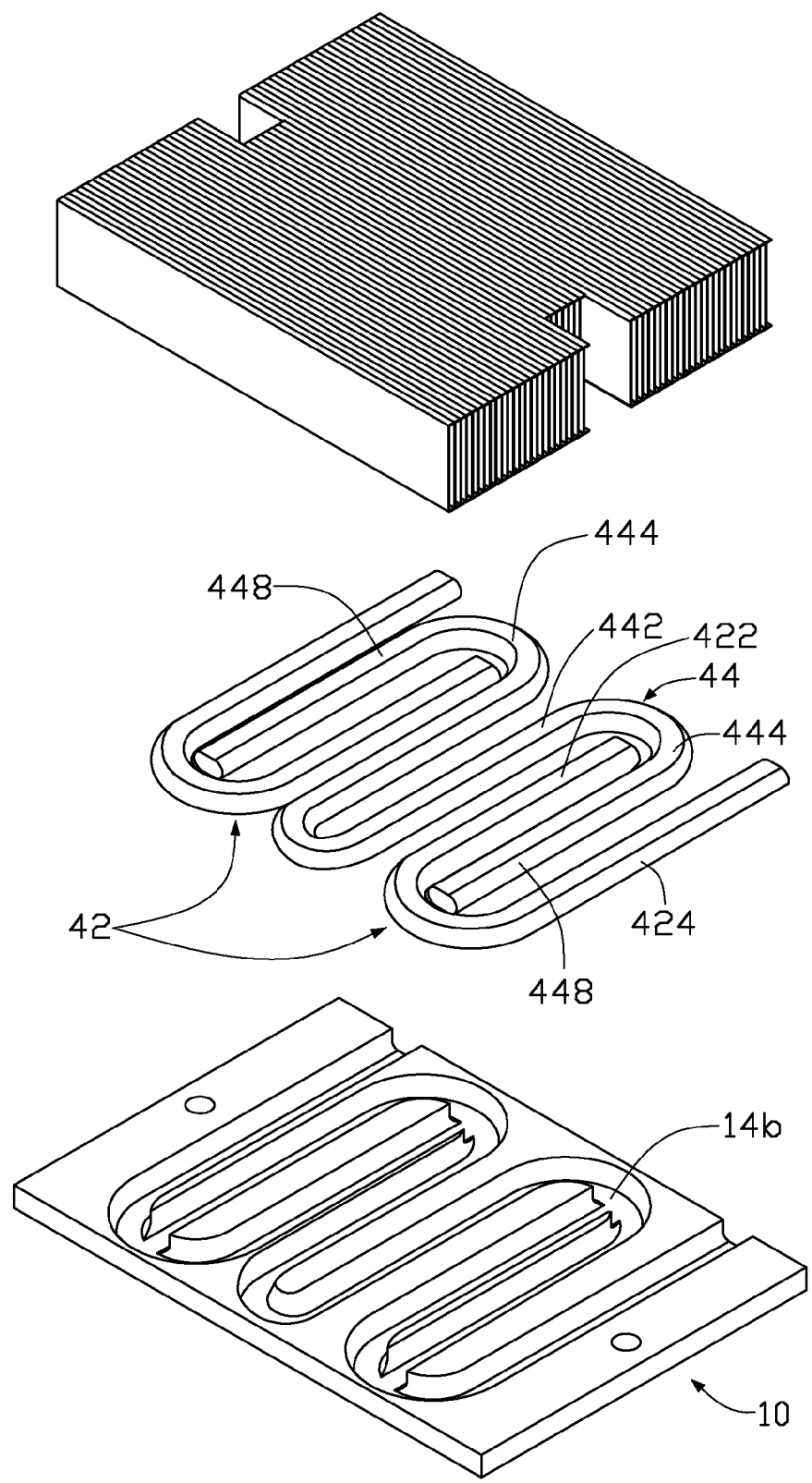
FIG. 4 is an exploded, isometric view of a heat dissipation device in accordance with a third embodiment of the present invention.

Referring to FIG. 4, a heat dissipation device in accordance with a third embodiment of the present invention is shown. The heat dissipation device is similar to the first embodiment of the present invention; a difference therebetween is that a first heat pipe 44 of this embodiment is substantially M-shaped to replace the S-shaped first heat pipe 36 of the first embodiment. The base 10 defines an M-shaped first groove 14b to replace the S-shaped first groove 14 of the first embodiment, in order to receive the first heat pipe 44 therein. The first heat pipe 44 comprises a first, U-shaped transferring portion 442 located in the center portion of the top face of the base 10, two arc-shaped second transferring portions 444 extending from opposite free ends of the first transferring portion 442 in opposite extension directions. A linear third transferring portion 448 extends from an outer end of a corresponding one of the second transferring portions 444 of the first heat pipe 44. The two linear third transferring portions 448 extend in the same extension direction so that they are parallel to each other. A pair of U-shaped second heat pipes 42 are provided in the third embodiment and each comprise a first transferring section 422 and a second transferring section 424 extending from a free end of the first transferring section 422 and parallel to the first transferring section 422. The third transferring portion 448 of the first heat pipe 44 is located between the first and second transferring sections 422, 424 of a corresponding one of the second heat pipes 42. The second heat pipes 42 are oriented to have the same opening direction. The first transferring portion 442 of the first heat pipe 44 is located in the center portion of the top face of the base 10, while the second transferring sections 424 of the second heat pipes 42 are located away from the center portion of the top face of the base 10. The second transferring portions 444 of the first heat pipe 44 enclose free ends of the first transferring sections 422 of the second heat pipes 42, respectively. By the provision of the first and second heat pipes 44, 42, the contacting area between the heat pipes 42, 44 and the base 10 is increased greatly and the heat dissipation capacity of the heat dissipation device of the present invention is improved greatly.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for removing heat from a heat generating electronic device, the heat dissipation device comprising:
   a base for contacting with the electronic device;
   a first heat pipe thermally embedded in the base, the first heat pipe comprising a first transferring portion and two second transferring portions extending from two opposite free ends of the first transferring portion in opposite extension directions, the first heat pipe being S-shaped in profile;
   a U-shaped, second heat pipe thermally embedded in the base, the second heat pipe comprising a first transferring section and a second transferring section curved from an end of the first transferring section of the second heat pipe;
   a U-shaped, third heat pipe thermally embedded in the base, the third heat pipe having a first transferring section and a second transferring section curved from an end of the first transferring section of the third heat pipe; and
   a fin set thermally contacting the base for dissipating the heat in the base;
   wherein one of the second transferring portions of the first heat pipe is located between the first and second transferring sections of the second heat pipe and the other of the second transferring portions of the first heat pipe is located between the first and second transferring sections of the third heat pipe;
   wherein the second heat pipe has an orientation opposite from that of the third heat pipe, the second and third heat pipes being located at two opposite sides of the first heat pipe, respectively;
   wherein the first transferring section of the second heat pipe and the first transferring portion of the first heat pipe are located in a center portion of the base and the second transferring section of the second heat pipe and the second transferring portions of the first heat pipe are located away from the center portion of the base; and
   wherein the first transferring portion of the first heat pipe is located between the two first transferring sections of the second and third heat pipes.

2. The heat dissipation device of claim 1, wherein the second transferring section of the second heat pipe and the second transferring section of the third heat pipe are arranged adjacent to the second transferring portions of the first heat pipe, respectively.

3. The heat dissipation device of claim 1, wherein the first transferring portion and two second transferring portions of the first heat pipe and the first and second transferring sections of the second and third heat pipes are straight and parallel to each other.

4. A heat dissipation device for removing heat from a heat generating electronic device, the heat dissipation device comprising:
   a base for contacting with the electronic device;
   a first heat pipe thermally embedded in the base, the first heat pipe comprising a first transferring portion and two second transferring portions extending from two opposite free ends of the first transferring portion in opposite extension directions;
   a second heat pipe thermally embedded in the base, the second heat pipe comprising a first transferring section and a second transferring section curved from an end of the first transferring section of the second heat pipe; and
   a fin set thermally contacting the base for dissipating the heat in the base;
   wherein at least a part of one of the second transferring portions of the first heat pipe is located beteween and immediately surrounded by the first and second transferring sections of the second heat pipe;
   wherein each of the first and second heat pipes is S-shaped in profile, and the second heat pipe further has a third transferring section curved from a free end of the second transferring section of the second heat pipe, extending in a direction opposite to that of the first transferring section of the second heat pipe and being distant from the first transferring section of the second heat pipe.

5. The heat dissipation device of claim 4, wherein the third transferring section of the second heat pipe is parallel to the first transferring section of the second heat pipe.

* * * * *